United States Patent [19]
Takenouchi et al.

[11] Patent Number: 6,159,777
[45] Date of Patent: *Dec. 12, 2000

[54] METHOD OF FORMING A TFT SEMICONDUCTOR DEVICE

[75] Inventors: Akira Takenouchi; Atsunori Suzuki; Hideto Ohnuma; Hongyong Zhang, all of Kanagawa; Shunpei Yamazaki, Tokyo, all of Japan

[73] Assignee: Semiconductor Energy Laboratory Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/967,317

[22] Filed: Oct. 28, 1997

Related U.S. Application Data

[60] Continuation of application No. 08/650,864, May 20, 1996, abandoned, which is a division of application No. 08/190,846, Feb. 3, 1994, Pat. No. 5,561,081.

[30] Foreign Application Priority Data

Feb. 4, 1993 [JP] Japan ................................. 5-40572

[51] Int. Cl.[7] ................................................. H01L 21/84
[52] U.S. Cl. ................................................. 438/149
[58] Field of Search .................... 438/149, 150, 438/162, 166

[56] References Cited

U.S. PATENT DOCUMENTS

| | | | |
|---|---|---|---|
| 3,667,832 | 6/1972 | Kitano et al. | 350/175 GN |
| 4,059,461 | 11/1977 | Fan et al. | |
| 4,309,224 | 1/1982 | Shibata | 427/555 |
| 4,370,175 | 1/1983 | Levatter | 148/1.5 |

(List continued on next page.)

FOREIGN PATENT DOCUMENTS

| | | | |
|---|---|---|---|
| 55-32026 | 3/1980 | Japan | G02F 1/133 |
| 58-127318 | 7/1983 | Japan . | |
| 58-191420 | 11/1983 | Japan . | |

(List continued on next page.)

OTHER PUBLICATIONS

T. Hempel, "Needle–Like Crystallization of Ni Doped Amorphous Silicon Thin Films", Solid State Communications, vol. 85, No. 11, pp. 921–924 (no month given), 1993.

H. Kuriyama, "Lateral Grain Growth of Poly–Si Films with a Specific Orientation by an Excimer Laser Annealing Method", Jpn. J. Appl. Phys.. vol. 32, No. 12B, pp. 6190–6195 (no month given), 1993.

M. Wagner et al., Appl. Surf. Sci., 43(1989)260 "Formation of p–n junctions and silicides . . . laser beam homogenization system", Dec. 1989.

Y.M. Jhon et al., Jpn.J. Appl. Phys. 33(10B)(Oct. 1994)L1438, "Crystallization . . . line shaped beam having a Gaussain profile".

Full translation of JP 2–73623, Publication Date Mar. 13, 1990.

Full translation of JP 3–286518, Publication Date Dec. 17, 1991.

Full translation of JP 64–76715, Publication Date Mar. 22, 1989.

(List continued on next page.)

*Primary Examiner*—Charles Bowers
*Assistant Examiner*—Keith Christianson
*Attorney, Agent, or Firm*—Eric J. Robinson; Nixon Peabody LLP

[57] ABSTRACT

An improved method of forming a semiconductor device on a glass substrate is described. The method comprises forming a semiconductor film on a glass substrate, heating the semiconductor film by means of a heater to a predetermined temperature, exposing the semiconductor film to pulsed laser light after the semiconductor film has been heated to the predetermined temperature by the heating step. The thermal shock due to sharp temperature change is lessened by the pre-heating step.

46 Claims, 7 Drawing Sheets

U.S. PATENT DOCUMENTS

| | | | |
|---|---|---|---|
| 4,379,727 | 4/1983 | Hansen et al. | 427/555 |
| 4,436,557 | 3/1984 | Wood et al. | 437/19 |
| 4,468,855 | 9/1984 | Sasaki | 427/555 |
| 4,473,433 | 9/1984 | Bosch et al. | 427/555 |
| 4,475,027 | 10/1984 | Pressley | 219/121 |
| 4,484,334 | 11/1984 | Pressley | 372/101 |
| 4,500,365 | 2/1985 | Mori | 427/555 |
| 4,546,009 | 10/1985 | Tiedje et al. | 437/170 |
| 4,646,426 | 3/1987 | Sasaki | 437/174 |
| 4,662,708 | 5/1987 | Bagdal | 350/6.9 |
| 4,733,944 | 3/1988 | Fahlen et al. | 350/167 |
| 4,851,978 | 7/1989 | Ichihara | 362/268 |
| 4,943,733 | 7/1990 | Mori et al. | 250/548 |
| 4,970,366 | 11/1990 | Imatou et al. | 219/121.68 |
| 4,997,250 | 3/1991 | Ortiz, Jr. | 350/96.18 |
| 5,097,291 | 3/1992 | Suzuki | 355/69 |
| 5,225,924 | 7/1993 | Ogawa et al. | 359/196 |
| 5,236,865 | 8/1993 | Sandhu et al. | 437/174 |
| 5,263,250 | 11/1993 | Nishiwaki et al. | 29/890.1 |
| 5,304,357 | 4/1994 | Sato et al. | 437/173 |
| 5,306,651 | 4/1994 | Masumo et al. | 437/40 |
| 5,413,958 | 5/1995 | Imahashi et al. | 437/173 |
| 5,424,244 | 6/1995 | Zhang et al. | 437/173 |
| 5,432,122 | 7/1995 | Chae | 437/173 |
| 5,561,081 | 10/1996 | Takenouchi et al. | 437/174 |
| 5,708,252 | 1/1998 | Shinohara et al. | 219/121.73 |

FOREIGN PATENT DOCUMENTS

| | | | |
|---|---|---|---|
| 59-45089 | 3/1984 | Japan | 219/121.8 |
| 60-227484 | 11/1985 | Japan | H01L 31/04 |
| 60-245124 | 12/1985 | Japan | H01L 21/20 |
| 60-257511 | 12/1985 | Japan | H01L 21/20 |
| 61-80815 | 4/1986 | Japan | H01L 21/20 |
| 61-141174 | 6/1986 | Japan | H01L 27/14 |
| 63-25933 | 2/1988 | Japan | H01L 21/322 |
| 1-76715 | 3/1989 | Japan . | |
| 1-187814 | 7/1989 | Japan | 148/DIG. 3 |
| 1-239837 | 9/1989 | Japan . | |
| 1-241862 | 9/1989 | Japan | H01L 27/12 |
| 220681 | 1/1990 | Japan | 219/121.75 |
| 2-73623 | 3/1990 | Japan . | |
| 2-255292 | 10/1990 | Japan . | |
| 2-294027 | 12/1990 | Japan | 437/174 |
| 3-286518 | 12/1991 | Japan . | |
| 4-338631 | 11/1992 | Japan | H01L 21/20 |
| 5-21339 | 1/1993 | Japan | H01L 21/20 |

OTHER PUBLICATIONS

Sera, Kenji et al., "High–Performance TFT's Fabricated by XeCl Excimer Laser Annealing of Hydrogenated Amorphous–Silicon Film", IEEE Transactions on Electron Devices, vol., 36, No. 12, Dec. 1989.

"Excimer Laser Annealing Apparatus Leonix", Chapter 2: Active Element Array Forming Technology of *Semiconductor World* 1993, pp. 196–197 with full translation.

Sameshima, Toshiyuki et al., XeCl Excimer Laser Annealing used to Fabricate Poly–Si TFT's Japanese Journal of Applied Physics, vol. 28, No. 10, Oct., 1989, pp. 1789–1793.

Konuma, T. et al., "P–28: 3.7–in.–Diagonal STN–LCD with Stripe Electrode Patterns Fabricated by an Excimer–Laser Scribing System", SID 93 Digest, pp. 550–553.

Morikawa, Akira et al., "Special Article: Present Situation of Laser Processing Technique—Application of Surface Modification by $CO_2$ Laser", Toshiba Corporation, Laser Group, Engineering Section, Mechatronics Apparatus Division, pp. 68–69 with full translation.. No Date.

Kaneko, Setsuo, "Excimer Laser Annealed Poly–Crystalline Silicon TFT", T. IEE Japan, vol. 110–A, No. 10, 1990, pp. 679–683 with full translation.

McGrath, Tim, "Applications of Excimer Lasers in Microelectronics", Solid State Technology, Dec. 1983, pp. 165–169.

Pennington, K.S., et al., "CCD Imaging Array Combining Fly's–eye Lens with TDI for Increased Light–Gathering Ability", IBM Technical Disclosure Bulletin, vol. 21, No. 2, Jul. 1978, pp. 857–858.

"Poly–Si By Excimer Laser Annealing With Solidification Process Control", 93/5vol. J76–C–II No. 5, pp. 241–248 from publication entitled "The Transactions of the Institute of Electronics Information and Communication Engineers". No Date.

Pennington, K.S. et al, "CCD Imaging Array Combining Fly's Eye Lens with TDI for Increasing Light–gathering Ability," IBM Technical Disclosure Bulletin, vol. 21 No. 2, Jul. 1978, pp. 857–858.

"Lateral Growth of Poly–Si Films With a Specific Orientation By An Excimer Laser Anneal Method", Jpn. J. Appl. Phys., vol. 32 (1993) Pt. 1 No. 12B, p. 6190.

"Improving the uniformity of Poly–Si Films Using a New Excimer Laser Annealing Method for Giant Microelectronics", Jpn. J. Appl. Phys., vol. 31 (1992) pp. 4550–4554, pt. 1, No. 12B, Dec. 1992.

"Enlargement of Poly–Si Film Grain Size By Excimer Laser Annealing And Its Application To High–Performance Poly–Si Thin Film Transistor" Japanese Journal of Applied Physics, vol. 30, No. 12B, Dec., 1991, pp. 3700–3703.

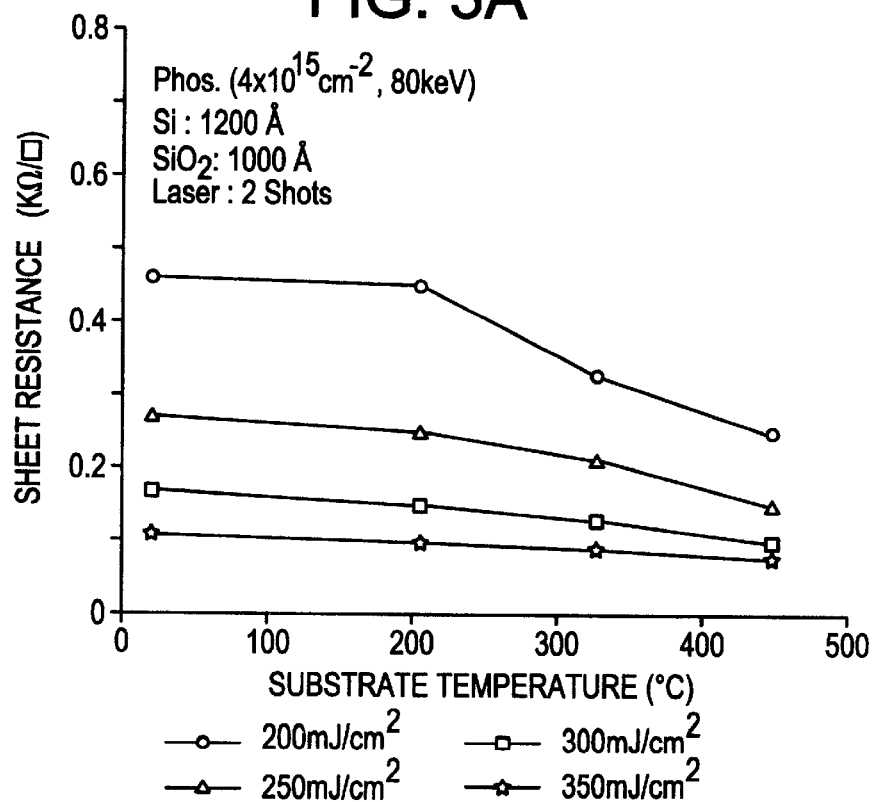
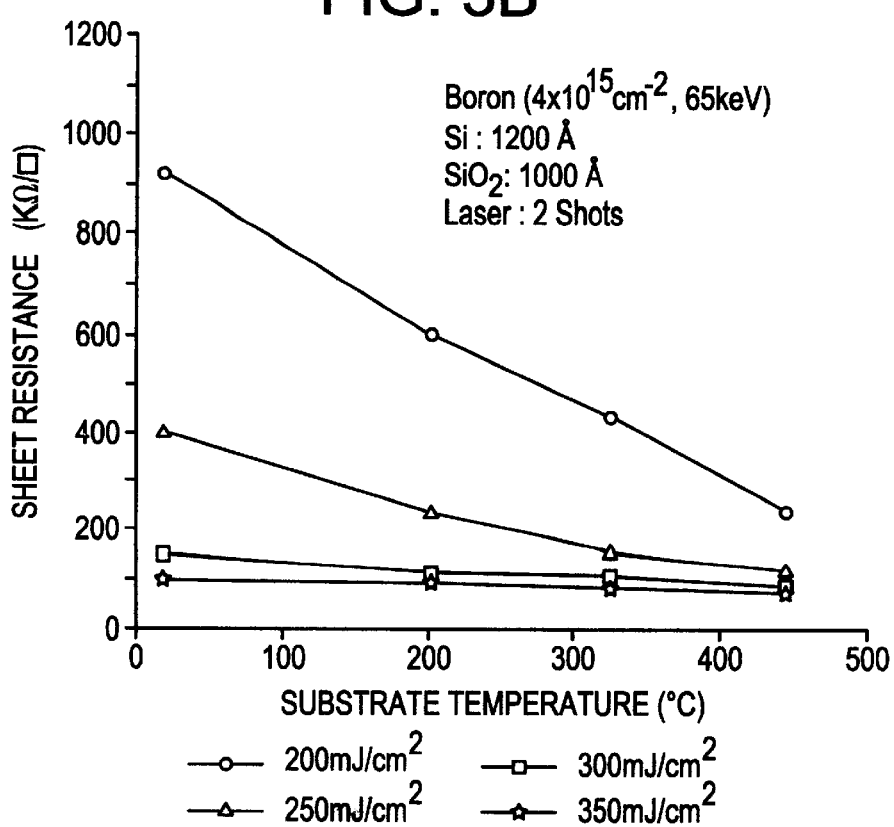

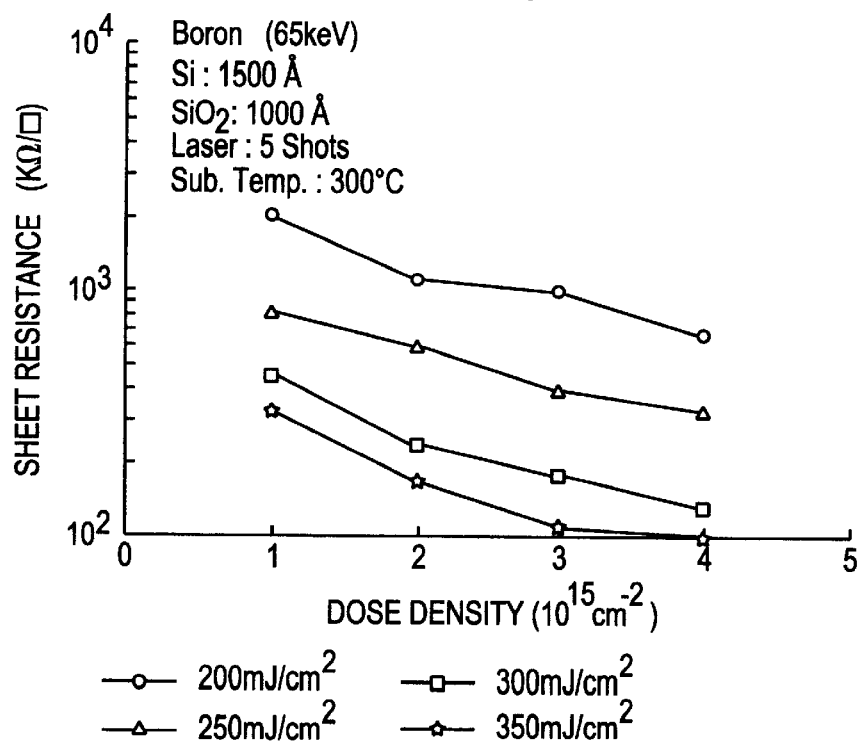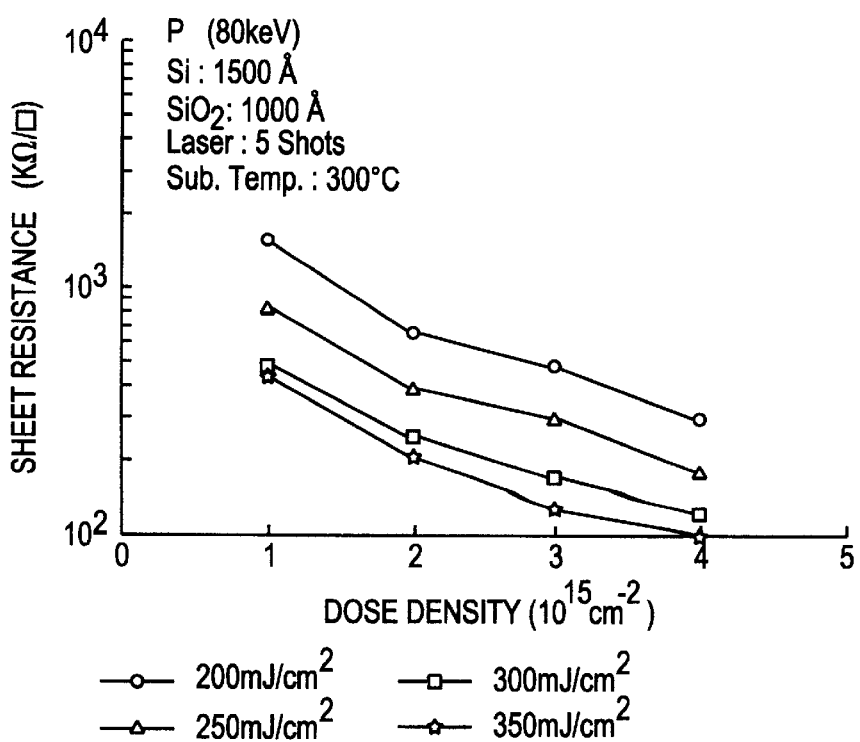

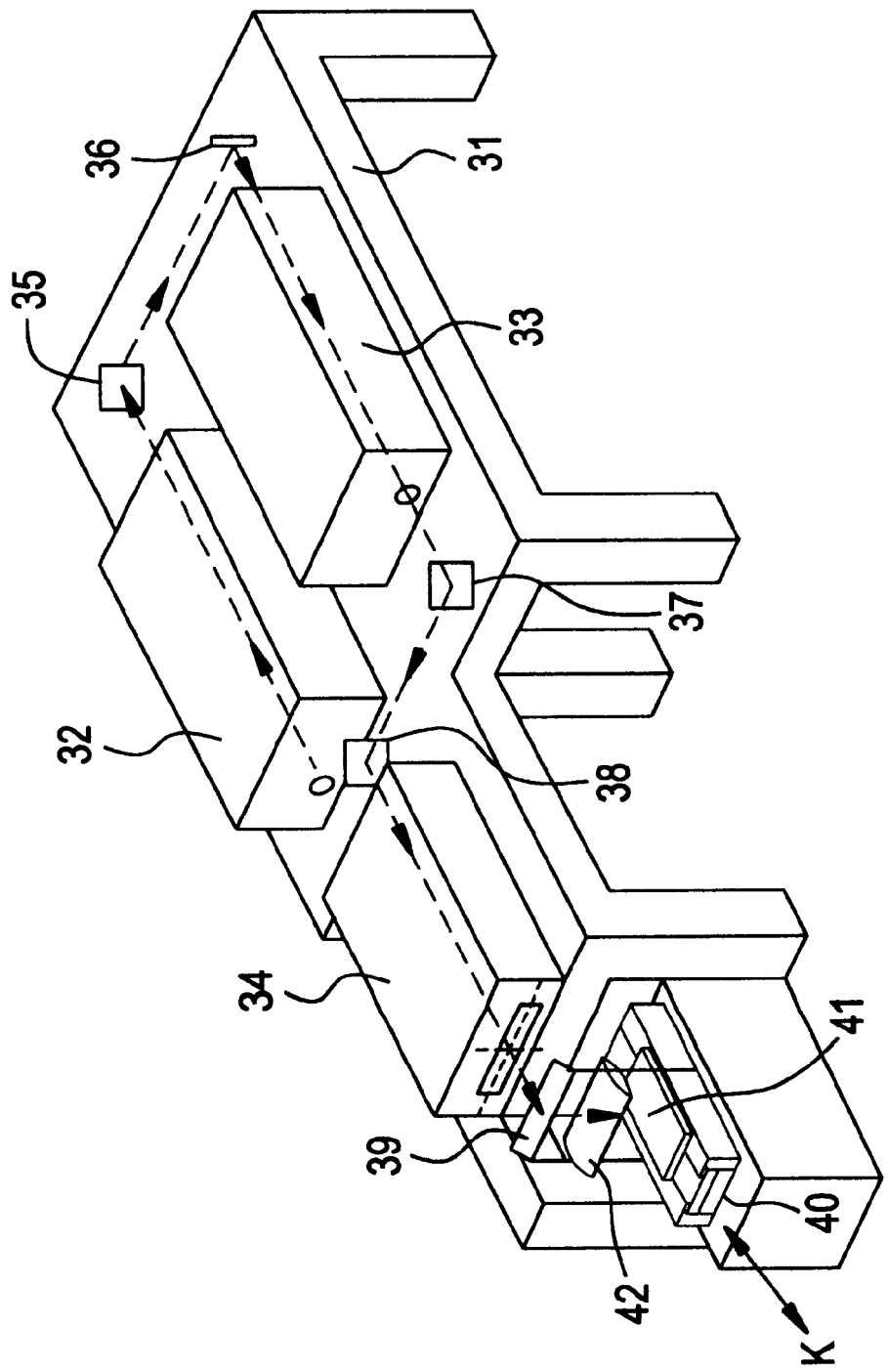

METHOD OF FORMING A TFT SEMICONDUCTOR DEVICE

This application is a Continuation of Ser. No . 08/650,864, filed May 20, 1996, now abandoned, which itself is a Divisional application of Ser. No. 08/190,846, filed Feb. 3, 1994, now U.S. Pat. No. 5,561,081.

BACKGROUND OF THE INVENTION

1. Field of the Invention

The present invention relates to a method of forming a semiconductor device by activating a semiconductor region with laser light.

2. Description of the Prior Art

Thin film semiconductor devices such as insulated gate thin film field effect transistors (TFTs) have been manufactured by introducing high energy ions into silicon semiconductor films by the ion implantation technique, the plasma doping technique and the like in order to form impurity semiconductor regions. The crystallinity of the semiconductor regions is substantially damaged due to the shock of the ion bombardment during the implantation. The crystallinity of the semiconductor regions must be recovered, e.g., by exposing the semiconductor regions to appropriate light emitted from a laser, a lamp or another suitable light source so that the impurity elements are activated in the semiconductor regions to accord necessary carrier transportation characteristics to them. Because of this, there is a need for a suitable technique by which laser annealing can be utilized for forming the insulated gate thin film field effect transistors since laser annealing is particularly suitable and advantageous for mass-production of semiconductor devices. Particularly, pulsed laser light can be used to effectively heat only the surface portion of the semiconductor region so that improvement of the productivity is expected.

The recrystallization of semiconductor regions by pulsed laser light, however, can not be sufficiently accomplished in accordance with conventional techniques due to a sharp change in temperature during the laser exposure step. Because of this, there tends to remain in the semiconductor region a portion whose crystallinity is inadequate for appropriate carrier transportation so as to lower the reliability of the insulated gate thin film field effect transistors.

BRIEF SUMMARY OF THE INVENTION

It is an object of the present invention to improve reliability of a method of forming a semiconductor device by decreasing the dose amount necessary for forming impurity semiconductor regions within a semiconductor film.

It is another object of the present invention to provide a reliable method of performing laser annealing for forming a semiconductor device wherein there is caused few defects in an impurity semiconductor film.

It is a further object of the present invention to provide a reliable method of performing laser annealing for forming a semiconductor device wherein the dose density of an impurity to be introduced into a semiconductor film is substantially decreased and therefore mass-productivity is improved.

It is a still further object of the present invention to provide a reliable method of performing laser annealing for forming a semiconductor device wherein the energy density of laser light necessary to activate an impurity semiconductor region is substantially decreased and therefore mass-productivity is improved.

It is a still further object of the present invention to provide a reliable method of performing laser annealing for forming a thin film semiconductor device such as a field effect transistor wherein an impurity semiconductor region is activated by laser light without causing much stress in the semiconductor region and therefore reliability is improved.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a method of forming a semiconductor device comprising the steps of heating a silicon film containing an impurity and exposing the silicon film to pulsed laser light to activate atoms of the impurity. Preferably, the substrate is heated in order that its temperature reaches a temperature of 100° C. to 500° C., The impurity is either or both phosphorous and boron. The energy density of the pulsed laser light is 200 to 400 mJ/cm$^2$. A higher energy density may damage the silicon semiconductor film.

In accordance with another aspect of the present invention, a method of forming a semiconductor device comprising the steps of forming a gate insulating film over a crystalline silicon film shaped in the form of an island on a substrate, forming a gate electrode on the gate insulating film, introducing phosphorous or boron into the crystalline silicon film through the gate electrode functioning as a mask, and irradiating with pulsed laser light the crystalline silicon having been heated to a temperature of no lower than 100° C., preferably to a temperature between 100° C. and 500° C. An appropriate source of the laser light is an excimer laser which is particularly suitable from the view point of mass-productivity. However, it may be appropriate to select another laser in place of an excimer laser as long as said another laser emits a light having a wavelength of 200 to 400 nm which is absorbed by a semiconduct or (e.g. silicon). In addition, it is effective for mass-production to scan a linear laser beam on the substrate in a direction perpendicular to the linear laser beam in order to uniformly irradiate the entire substrate with the laser beam.

As described in "Description of the Prior Art", in accordance with the conventional technique in which laser annealing is employed, the temperatures of the semiconductor region is quickly elevated due to absorption of laser light followed by a sharp drop in temperature due to heat dissipation because of such sharp change in temperature, the doped impurity atoms are immediately frozen before relocation in appropriate position in which the semiconductor regions are given necessary conductivity. As a result, the semiconductor region can not recover from the damage caused by bombardment of impurity atoms into the crystalline structure in which many defect are eventually generated and therefore lower the reliability of the semiconductor device.

Such sharp temperatures change is lessened by preheating the semiconductor regions in advance of the laser annealing. Namely, the temperature of the semiconductor regions only gradually varies during the laser annealing since the temperature is biassed in advance. Particularly, sharp drop in temperature can be effectively avoided so that the doped impurity atoms can be moved and relocated in appropriate positions and cause few defects.

On the other hand, it will be understood that necessary characteristics of the semiconductor regions such as the conductivity, the sheet resistance can be obtained only with a smaller amount of impurity atoms doped as compared with the conventional cases. This means that doping time is decreased and therefore the productivity is improved. The damage caused by impurity implantation is also lessened because the amount of impurity itself is decreased so that the productivity is further improved.

Another advantage of the present invention is reduction of the energy density of laser light since the temperature of the semiconductor regions is already elevated to a certain elevated temperature level. This means that a wider area of the semiconductor region can be treated at once since laser light can be expanded to a relatively low energy density and a wide span (width).

A further advantage of the present invention is elimination of the cause of reducing the reliability of thin film transistors manufactured by pulsed laser annealing. An insulated gate thin film field effect transistor is easily formed by the use of self-aligning technique utilizing the gate electrode as a mask when impurity atoms are introduced to form source and drain regions. The impurity regions are given laser annealing. Usually, the impurity region is irradiated from the upper side through the gate electrode to anneal the impurity regions adjacent to the gate electrode. In this case, however, serious stress is often caused at the boundaries between each of the source and drain regions and the channel region since there is substantial difference in temperature between the source and drain regions which are heated by exposure to laser light and the channel region which is not exposed to the light because of the presence of the gate electrode. Because of the thermal stress, there are generated many defects in the semiconductor region which lower the reliability of the thin film transistor.

The laser light can be irradiated to the semiconductor layer (e.g. silicon) through the upper surface of the semiconductor layer. In this case, it is preferable to use a laser light having a wavelength of 200 to 400 nm because the semiconductor can absorb the laser light having such a wavelength sufficiently.

If the laser light is projected through the bottom surface of the glass substrate in order to irradiate the semiconductor region only through the transparent glass substrate, the entirety of the semiconductor region is exposed to the laser light so that the above discussed problem (that is, the problem of stress) caused by the temperature difference seems to be solved. However, in practice, other difficulties are raised in this case. If the substrate is made of quartz, laser light emitted from a usual laser such as XeCl excimer laser (wavelength=308 nm) can be passed therethrough. In this case, however, an expensive quartz substrate must be used so that the production cost is substantially elevated. If the substrate is made of a borosilicate glass, e.g. Corning 7059 glass, laser light emitted from a usual laser is substantially absorbed by the substrate and therefore can not reach the semiconductor region. Laser light having a wavelength of no shorter than 400 nm is needed to pass through such a cheaper glass made mainly of a borosilicate glass. However, there have been few practicably available laser which can emit light of 400 to 650 wavelengths. Furthermore, if the wavelength of the laser light is those of infrared light or longer, even the semiconductor region can also not absorb the laser energy.

On the contrary, in accordance with the present invention, the semiconductor region is heated in advance so that the difference in temperature between the source and drain regions and the channel region is substantially lessened. Because of this, the undesirable stress caused therebetween is significantly reduced resulting in a high reliability.

BRIEF DESCRIPTION OF THE DRAWINGS

The accompanying drawings, which are incorporated in and form a part of the invention and, together with the description, serve to explain the principles of the invention.

FIG. 3(A) is a graphical diagram showing the relationship between the sheet resistance of semiconductor films and the substrate temperature in the case that the semiconductor films were doped with phosphorous.

FIG. 3(B) is a graphical diagram showing the relationship between the sheet resistance and the substrate temperature in the case that the semiconductor films were doped with boron.

FIG. 5(A) is a graphical diagram showing the relationship between the dose density of the impurity and the sheet resistance of semiconductor films in accordance with the present invention in the case that the semiconductor films were doped with phosphorous and that the thickness of the silicon semiconductor films was 1500 angstroms.

FIG. 5(B) is a graphical diagram showing the relationship between the dose density of the impurity and the sheet resistance of semiconductor films in accordance with the present invention in the case that the semiconductor films were doped with boron and that the thickness of the silicon semiconductor films was 1500 angstroms.

FIG. 6 is a schematic perspective view showing a linear laser annealing apparatus suitable for performing the laser annealing in accordance with the present invention.

DETAILED DESCRIPTION OF THE PREFERRED EMBODIMENTS

Figure 1A:
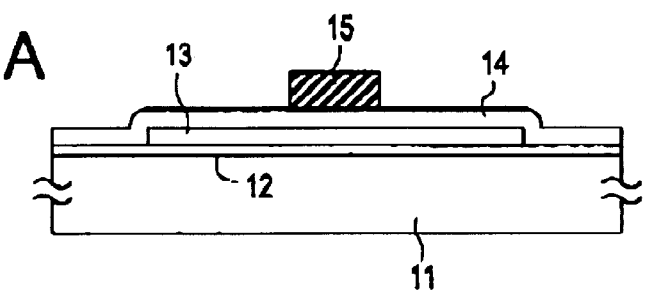
FIGS. 1(A) to (E) are cross sectional views showing a method of forming an n-type insulated gate thin film field effect transistor in accordance with a first embodiment of the present invention

The inventors have conducted experiments to estimate and confirm the effects and advantages of a method of forming a semiconductor device in accordance with the present invention as explained below in details. A silicon oxide film was deposited on each of sample substrate made of Corning 7059 glass by sputtering or plasma CVD to a thickness of 2000 angstroms in an atmosphere of argon and oxygen. An amorphous silicon semiconductor film is deposited on the silicon oxide film by plasma CVD or low pressure CVD technique to a thickness of 100 to 2000 angstroms, e.g. 1500 angstroms, and patterned to form an island on the substrate. The amorphous silicon semiconductor film is made of a substantially intrinsic semiconductor material.

The upper surface of this structure is coated with a silicon oxide film deposited by a plasma CVD technique to a thickness of 1000 angstroms. An impurity element was introduced into the semiconductor film by plasma doping. The impurity element was phosphorous introduced with phosphine ($PH_3$) at an acceleration voltage of 80 KeV or boron introduced with diboran ($B_2H_6$) at an acceleration voltage of 60 KeV. The dose density of the plasma doping was $4 \times 10^{15}$ cm$^{-2}$ respectively for each sample.

The respective sample substrate were heated to several temperature between room temperature to 450° C. respectively. The impurity atoms introduced into semiconductor films of the respective samples were activated by exposure to laser light. The laser light was preferably generated by a KrF excimer laser. The conditions of this laser annealing were as follows.

| | |
|---|---|
| Laser Energy Density: | 200 to 350 mJ/cm$^2$ |
| Shot Repetition: | 2 times |
| Wavelength: | 248 nm |
| Pulse Width: | 30 nsec |
| Atmosphere: | Pure nitrogen |

The sheet resistances of the semiconductor films of the respective samples were measured. As a result, graphical diagrams shown in FIGS. 3(A) and 3(B) were obtained. FIG. 3(A) is a graphical diagram showing the relationship between the sheet resistance and the substrate temperature in the case that the semiconductor films were doped with phosphorous. FIG. 3(B) is a graphical diagram showing the relationship between the sheet resistance and the substrate temperature in the case that the semiconductor films were doped with boron. In the case that it is desired to obtain 300 ohms per square or lower sheet resistances by activation of the phosphorous-doped the semiconductor films, laser energy density of 200 mJ/cm$^2$ is sufficient for this purpose when the substrate is heated to 450° C. during activation process whereas 250 mJ/cm$^2$ or higher laser energy densities may be needed for the same purpose if the substrate is not heated. Accordingly, the required energy can be reduced by 20% by employing preheating the substrate. In the case that it is desired to obtain 400 ohms per square or lower sheet resistances by activation of the boron-doped the semiconductor films, laser energy density of 200 mJ/cm$^2$ can be employed for this purpose when the substrate is heated to 300 to 350° C. during activation process whereas 250 mJ/cm$^2$ or higher laser energy densities may be needed for the same purpose if the substrate is not heated.

Figure 4A:
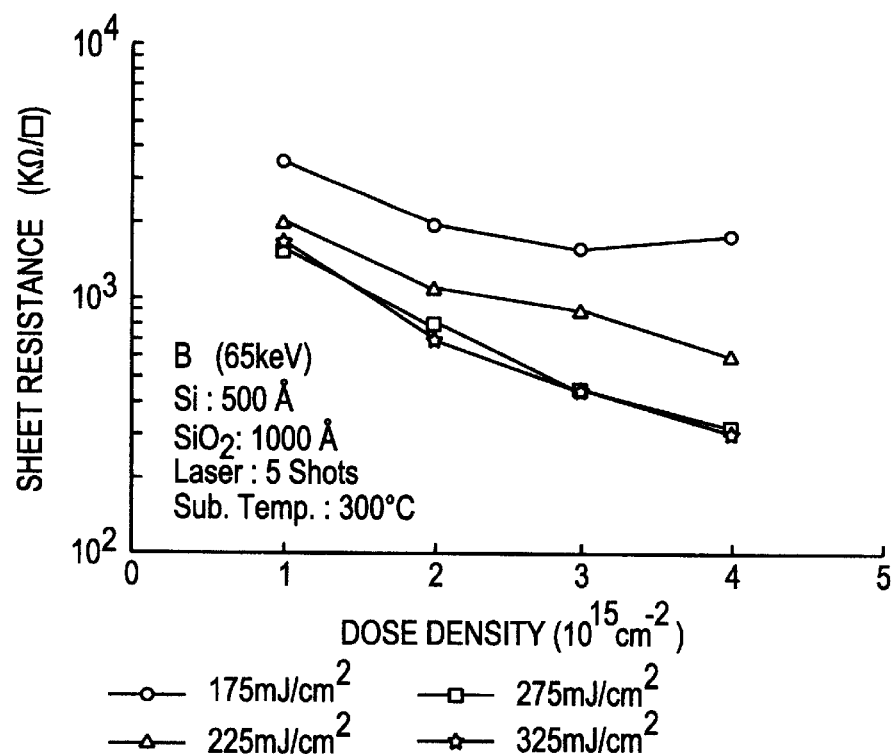
FIG. 4(A) is a graphical diagram showing the relationship between the dose density of the impurity and the sheet resistance of semiconductor films in accordance with the present invention in the case that the semiconductor films were doped with phosphorous and that the thickness of the silicon semiconductor films was 500 angstroms.
Figure 4B:
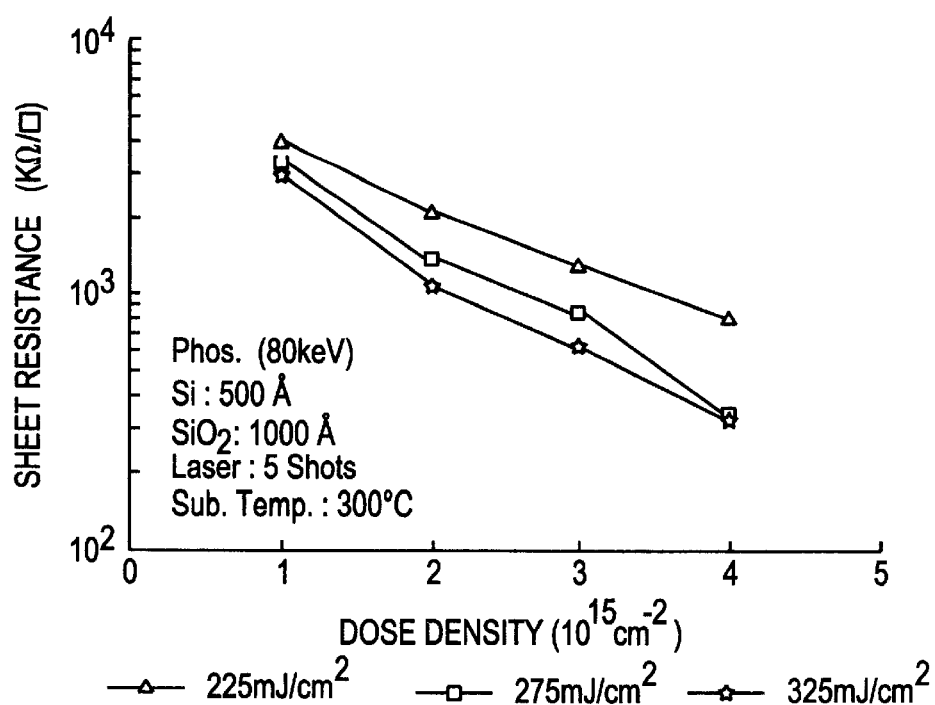
FIG. 4(B) is a graphical diagram showing the relationship between the dose density of the impurity and the sheet resistance of semiconductor films in accordance with the present invention in the case that the semiconductor films were doped with boron and that the thickness of the silicon semiconductor films was 500 angstroms.

Similar experiments were also conducted in order to investigate the relationship between the dose density of the impurity and the sheet resistance. In this case, the dose density was selected to be several values from $1 \times 10^{15}$ cm$^{-2}$ to $4 \times 10^{15}$ cm$^{-2}$ while the substrate temperature was kept at 300° C. FIGS. 4(A) and 4(B) and FIGS. 4(A) and 4(B) are graphical diagrams showing the results of the experiments. FIGS. 4(A) and 4(B) were plotted in the case that the thickness of the silicon semiconductor films was 500 angstroms and FIGS. 5(A) and 5(B) were plotted in the case that the thickness of the silicon semiconductor films was 1500 angstroms. It was confirmed from these experiments that a lower sheet resistance can be obtained with a higher dose density and that a thicker semiconductor film has a lower sheet resistance than a thinner semiconductor film has when other formation conditions are equal. When applied for forming thin film field effect transistor, it is desirable to reduce the sheet resistance to 500 ohms per square or lower. This end can be achieved even with a dose density of $1 \times 10^{15}$ cm$^{-2}$. If the thickness of the silicon semiconductor film, the substrate temperature and the laser energy density are 1500 angstroms, 300° C. and 300 mJ/cm$^2$ respectively.

Referring now to FIGS. 1(A) to 1(E), a method of forming an n-type insulated gate thin film field effect transistor in accordance with a first embodiment of the present invention will be explained.

A silicon oxide film 12 is deposited on a Corning 7059 glass substrate by a plasma CVD technique to a thickness of 500 to 2500 angstroms in an atmosphere of tetraethoxysilane and oxygen. An amorphous silicon semiconductor film is deposited on the silicon oxide film 12 by a plasma CVD technique in the same manner to a thickness of 100 to 2000 angstroms e.g. 1500 angstroms to be source, channel and drain regions. The amorphous silicon semiconductor film is made of a substantially intrinsic semiconductor material. The silicon oxide 12 and the amorphous silicon semiconductor film are sequentially formed by means of a multi-chamber system comprising at least two vacuum chambers whose inside spaces are isolated from air.

The glass substrate 11 coated with the silicon oxide film 12 and the amorphous silicon semiconductor film is then dehydrogenized at 430° C. for 30 to 60 minutes followed by thermal annealing at 600° C. for 24 to 48 hours in order to crystallize the amorphous silicon semiconductor film. It is effective to carry out this crystallization by irradiating a laser light to the amorphous silicon film while heating the amorphous silicon film. For example, the amorphous silicon film is thermally annealed by irradiating a laser light having a wavelength of 308 nm using the apparatus of FIG. 6 while heating the substrate to 300° C. The atmosphere may be a vacuum for heat insulation. Nitrogen atmosphere under atmospheric pressure is also favorable. The irradiation of the laser light may be carried out after forming the silicon island region. It is effective to promote crystallization as follows. The amorphous silicon film is first crystallized by heating, and next patterned into an island, and thereafter the silicon island is irradiated with a laser light for the promotion of the crystallization. The amorphous silicon semiconductor film is then patterned to form a semiconductor region 13 in the form of an island. The upper surface of this structure is coated with a silicon oxide film 14 deposited by a plasma CVD technique to a thickness of 1000 angstroms. An aluminum film is also deposited by vacuum evaporation to a thickness of 5000 angstroms and patterned to form a gate electrode 15 as shown in FIG. 1(A).

Figure 1B:
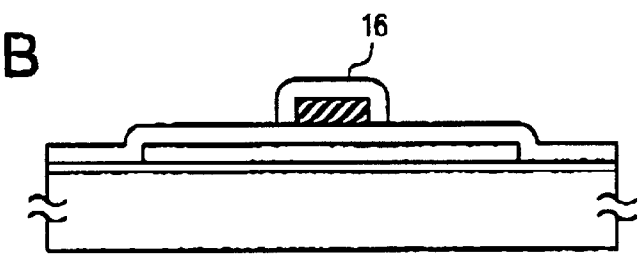

The substrate is placed in a 3% ethylene glycol solution of dihydroxysuccinic acid for anoding. A current is passed through the solution with the gate electrode 15 as an anode and a platinum as a cathod which is also placed in the solution to initiate anodic oxidation. The current is kept constant during the anodic oxidation while the voltage between the anode and the cathod is gradually increased to 220V. As a result, an anodic oxidation film 16 is formed around the gate electrode 15 as illustrated in FIG. 1(B). The anodic oxidation film 16 and the gate electrode 15 are collectively called simply as the gate electrode 15 hereinbelow.

Figure 1C:
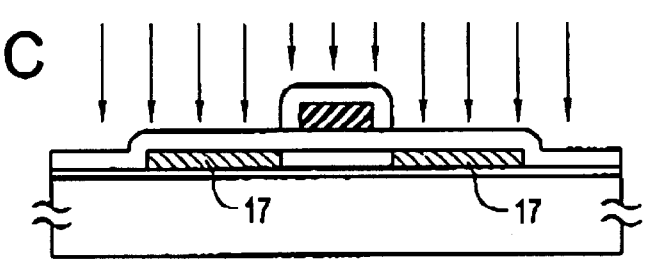
Figure 1D:
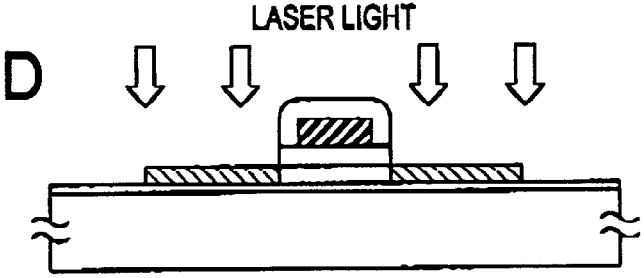

Next, an impurity element is introduced into the semiconductor region 13 by plasma doping with the gate electrode 15 as a mask. The impurity element is, for example, phosphorous to form source and drain regions 17 as illustrated in FIG. 1(C). The conditions of the plasma doping are as follows.

Figure 2A:
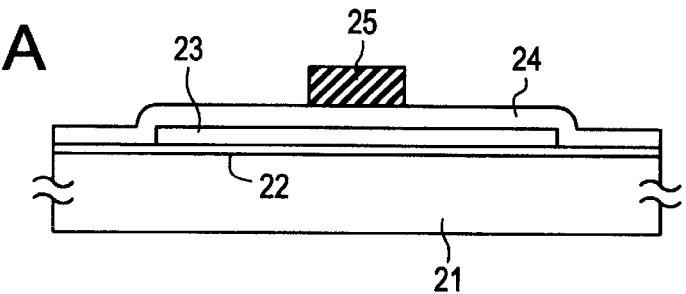
FIGS. 2(A) to (E) are cross sectional views showing a method of forming an n-type insulated gate thin film field effect transistor in accordance with a second embodiment of the present invention
Figure 2B:
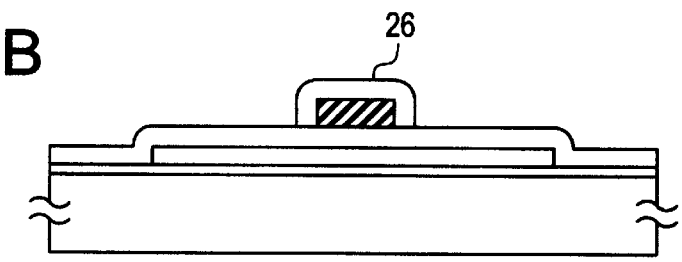
Figure 2C:
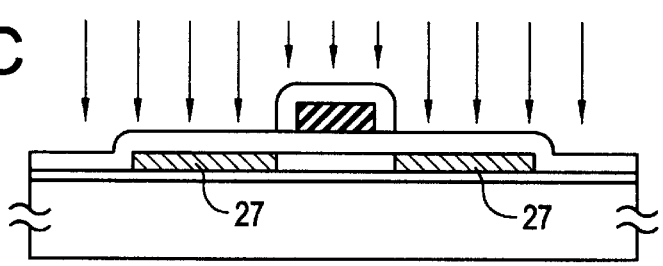
Figure 2D:
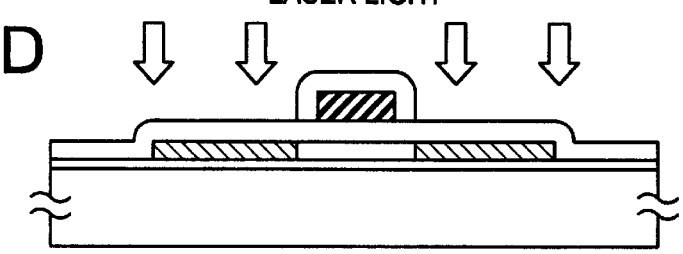

Dose Density: $1 \times 10^{14}$ to $5 \times 10^{15}$ cm$^{-2}$, e.g. $1 \times 10^{15}$ cm$^{-2}$ Acceleration Voltage: 30 to 120 KV, e.g. 80 kV RF plasma power: 5 to 50 W, e.g. 10 to 20 W The silicon oxide film 14 is removed by etching with hydrogen fluoride except for the portion located just below the gate electrode 15 to expose the source and drain regions 17. The substrate is heated by means of a heater to a temperature no lower than 100° C. e.g., 300° C. for example. The substrate temperature is preferably selected to be no higher than 450° C. in order to avoid possible damage on the source and drain regions 27. The source and drain regions 27 is then exposed to laser rays from the upper side as illustrated in FIG. 2(D). The laser rays are preferably generated by a KrF excimer laser. The conditions of this laser annealing are as follows.

Laser Energy Density: 200 mJ/cm$^2$

Shot repetition: 5 times

Substrate temperature: 300° C.

Atmosphere: 100% nitrogen under atmospheric pressure

Since the source and drain regions 17 are exposed to the laser light, the impurity atoms contained therein sufficiently activated in spite of the low laser energy such as 200 mJ/cm$^2$. As a result, relatively high sheet resistances of the source and drain regions 17 can be realized typically as high as 300 to 500 ohms per square even though the dose density is only a fourth of a conventionally employed density.

Figure 1E:
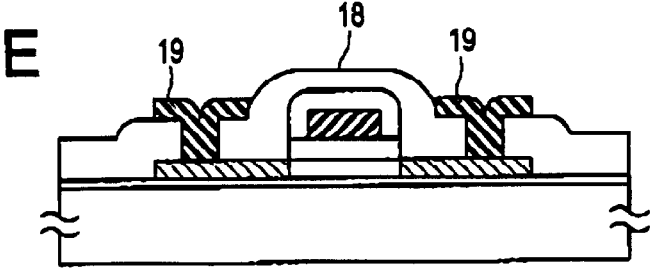

Next, A silicon oxide film 19 is deposited over the gate electrode 15 by a plasma CVD technique to a thickness of 2000 to 30000 angstroms e.g. 6000 angstroms. After opening contact holes, an aluminum film is deposited to contact with the source and drain regions 17 respectively through the contact holes and patterned to provide source and drain electrodes 19 as illustrated in FIG. 1(E).

In accordance with experiments conducted by the inventors, the thin film transistors formed typically had carrier mobilities as high as 50 to 90 cm$^2$/Vs. Similar thin film transistors were formed in accordance with a conventional method for the purpose of estimating the improvement of reliability of the thin film transistor according to this embodiment of the present invention as compared to the conventional technique. The formation condition in accordance with the conventional technique were selected to equal to those of the above-explained embodiment except for the followings.

Dose Density: $4 \times 10^{15}$ cm$^{-2}$

Laser Energy Density: 250 mJ/cm$^2$

With the respective sources being grounded. 25V was applied for an hour between the respective drain and gate terminals of each of the thin film transistors according to the present invention and the conventional technique. As a result, the fluctuation of the threshold voltage and the reduction of the ON current after the voltage application was continued for an hour were limited to less than 0.1V and less than 10% in the case of the transistor in accordance with the present invention whereas the corresponding fluctuation and the reduction in the case of the conventional technique were measured to exceed 1.6V and 60% respectively. The improvement of reliability was then confirmed by the experiments.

Referring now to FIGS. 6 and 7(A) to 7(C), a linear laser annealing apparatus suitable for performing the laser annealing in accordance with the present invention as explained above will be described. A linear laser beam is scanned on the semiconductor layer in a direction perpendicular to the linear beam. A continuous scanning and a step scanning are effective. The continuous scanning (sweeping) is effective for the case that the number of laser shots is large. The step scanning is effective for the case that the width of the laser beam is large since the mass-productivity is improved. FIG. 6 is a schematic perspective view showing the linear laser annealing apparatus. The apparatus comprises a pair of lasing resonators 32 and 33 mounted on a table 31, total reflection mirrors 25 to 39, an optical system 34 for screezing in one direction and expanding in another direction the laser light entering therein in order to make the laser light flat and a stage 40 on which is movably supported a substrate 41 on which a semiconductor film is deposited and doped with an impurity. When laser annealing is initiated, laser light is emitted from the resonator 32, reflected upon the total reflection mirrors 35 and 36 and then passed through the other resonator 38 in which the laser light is further amplified to a necessary energy level. The laser light amplified in the other resonator 38 is then reflected upon the total reflection mirrors 37 and 38 and passed through the optical system 34 in which the cross section of the laser light is reshaped from 3 cm width and 2 cm height to 10 to 30 cm width and 0.1 to 1 cm height. The flat laser light is reflected by the total reflection mirror 39 and projected onto the substrate 41 through a cylindrical focussing lense 42. The width of the laser light is designed to be larger than that of the substrate to be treated so that the whole area of the semiconductor region can be annealed by the laser light by moving the substrate only in one direction perpendicular to the propagation direction of the laser light during the laser emission. That is, the substrate 41 is scanned in the direction K as indicated in FIG. 6. The supporting structure including the stage 40 can therefore be designed in a simple structure. An appropriate heater is provided in the stage in order to heat the substrate to a predetermined temperature. The final energy carried out by the laser light is 1000 mJ per shot at maximum. The shot rate is 50 to 500 shots/min.

Figure 7A:
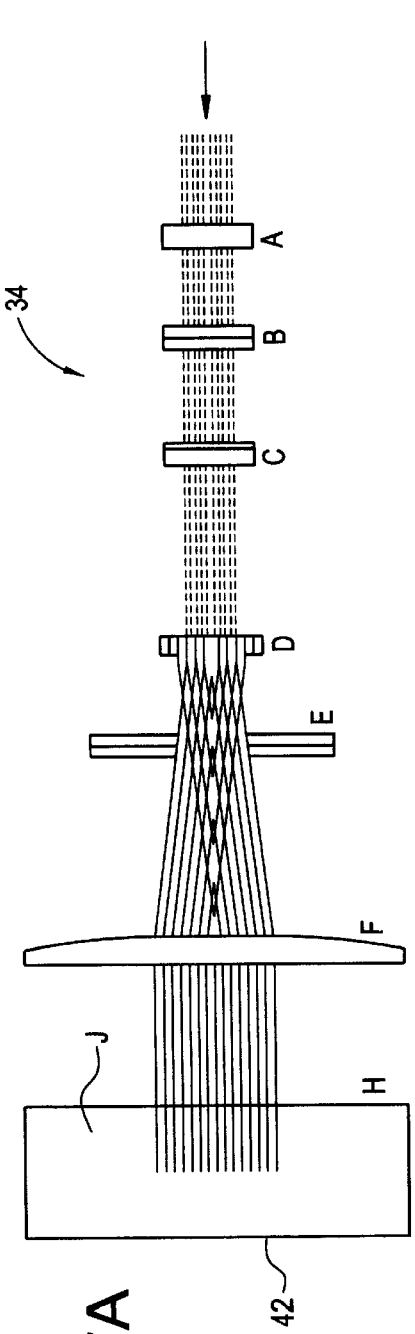
FIGS. 7(A), 7(B) and 7(C) are a plan view, a side view and a perspective view showing the details of the optical system 34 provided in the linear laser annealing apparatus in accordance with the present invention illustrated FIG. 6.
Figure 7B:
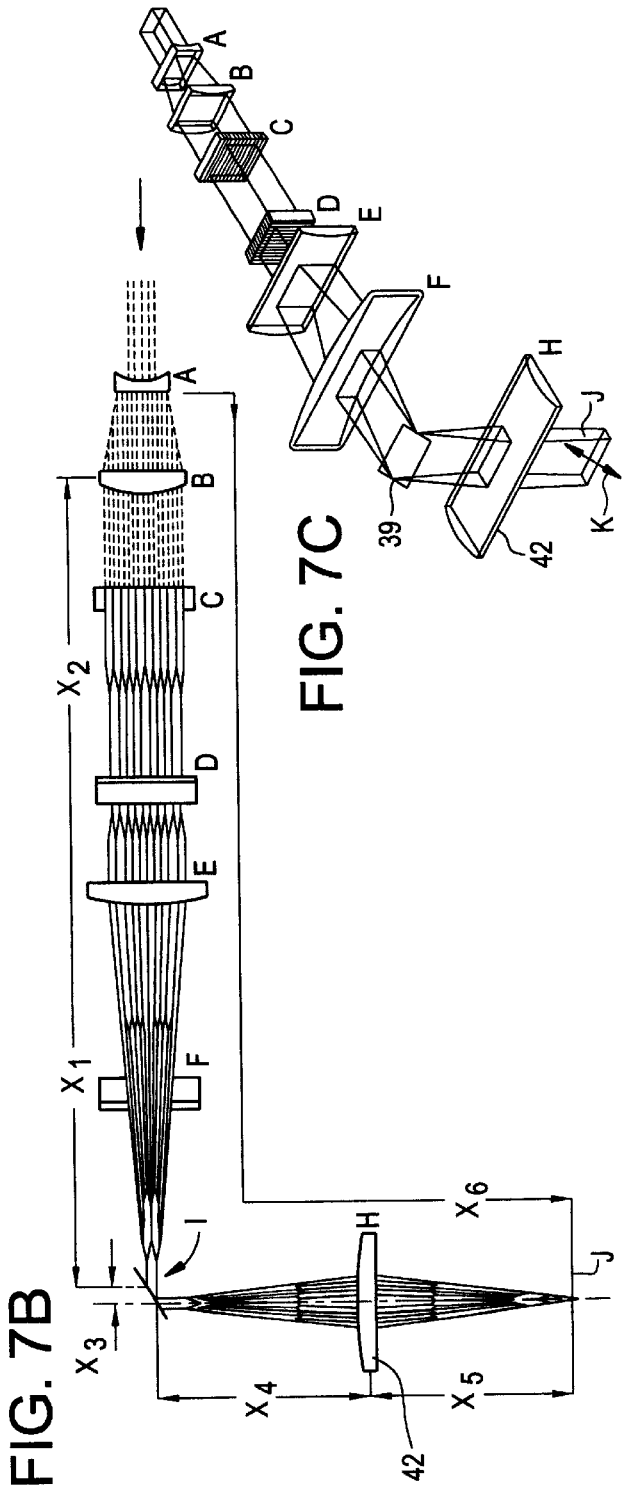
Figure 7C:
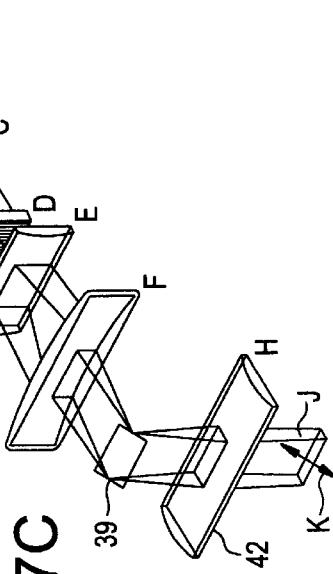

FIGS. 7(A). 7(B) and 7(C) are a plan view, a side view and a perspective view showing the optical axis of the optical system 34 of FIG. 6. The optical system 34 comprises a cylindrical concave lense A, a cylindrical convex lense B, a horizontal flyeye lense C, a vertical flyeye lense D, a cylindrical convex lense E and a cylindrical convex lense F. The horizontal flyeye lense C and the vertical flyeye lense D are provided for the purpose of converting Gauss distribution of laser energy to a rectangular distribution. In the figures, there are illustrated characteristic dimmensions $X_1$ to $X_6$. While the dimmensions $X_1$ and $X_2$ are fixed, the dimmensions $X_3$ between the virtual focus I and the mirror 39 and the dimmensions $X_4$ and $X_5$ are adjusted in order to obtain appropriate the magnification M and the focal distance F. The total travel length $X_6$ of the laser light is about 1.3 m for example. There are following relationships theareamong.

$$M=(X_3+X_4)/X_5$$

$$1/F=1/(X_3+X_4)+1/X_5$$

The original laser light is shaped into a very long linear laser light to improve processability. That is, the linear beam is emitted from the optical system 34, and thereafter irradiated to the sample 41 through the total reflection mirror 39. Because the length of the linear beam is longer than the width of the sample, the entire surface of the sample can be irradiated with a laser light by moving the sample only in one direction perpendicular to the linear beam. Accordingly, one axis structure can be used for the stage for the sample and the driving device 40 to make easy the maintenance and the alignment of the sample with the stage.

Referring now to FIGS. 2(A) to 2(E), a method of forming an n-type insulated gate thin film field effect transistor in accordance with a second embodiment of the present invention will be explained.

A silicon oxide film 22 is deposited on a Corning 7059 glass substrate by a sputtering to a thickness of 500 to 2500 angstroms in an atmosphere of argon and oxygen. The proportion of oxygen in the atmosphere is no lower than 50%. Sputtering is sequentially carried out with a target of nickel for 1 to 5 minutes under a weak nitrogen plasma (20 W) after the deposition of silicon oxide. As a result, nickel is formed on the surface of the silicon oxide film 22 in the form of a layer of 10 to 100 atoms in average. This nickel is very effective to promote the crystallization. An amorphous silicon semiconductor film is deposited on the silicon oxide film 22 by a plasma CVD technique in the same manner to a thickness of 1500 angstroms to be source, channel and drain regions. The amorphous silicon semiconductor film is made of a substantially intrinsic semiconductor material. The sputtering of silicon oxide and the nickel and the formation of the amorphous silicon semiconductor film are sequentially performed by means of a multi-chamber system comprising at least three vacuum chambers whose inside spaces are isolated from air.

The glass substrate 21 coated with the silicon oxide film 22 and the amorphous silicon semiconductor film is then dehydrogenized at 430° C. for 30 to 60 minutes followed by thermal annealing at 550° C. for 2 to 4 hours in order to crystallize the amorphous silicon semiconductor film. This thermal annealing can carry out a step for forming a crystal nucleus. Alternatively, this thermal annealing can grow a crystal by lengthening the annealing time. The amorphous silicon semiconductor film is then patterned to form a semiconductor region 23 in the form of an island. Thereafter, the surface of the semiconductor region 23 is irradiated with a linear laser light to grow a crystal. The upper surface of this structure is coated with a silicon oxide film 24 deposited by a plasma CVD technique to a thickness of 1000 angstroms. An aluminum film is also deposited by vacuum evaporation to a thickness of 5000 angstroms and patterned to form a gate electrode 25 as shown in FIG. 2(A). The substrate is placed in a 3% ethylene glycol solution of dihydroxysuccinic acid for anoding. A current is passed through the solution with the gate electrode 25 as an anode and a platinum as a cathod which is also placed in the solution to initiate anodic oxidation. The current is kept constant during the anodic oxidation while the voltage between the anode and the cathod is gradually increased to 220V. As a result, an anodic oxidation film 26 is formed around the gate electrode 25 as illustrated in FIG. 2(B). The anodic oxidation film 26 and the gate electrode 15 are collectively called simply as the gate electrode 25 hereinbelow. Next, an impurity element is introduced into the semiconductor region 23 by plasma doping with the gate electrode 25 as a mask. The impurity element is, for example, phosphorous to form source and drain regions 27 as illustrated in FIG. 2(C). The conditions of the plasma doping are as follows.

Dose Density: $1 \times 10^{14}$ to $5 \times 10^{15}$ cm$^{-2}$ e.g. $2 \times 10^{15}$ cm$^{-2}$
Acceleration Voltage: 20 to 120 KV, e.g. 80 kV
RF plasma power: 5 to 50 W, e.g. 10 to 20 W The substrate is heated by means of a heater to 300° C. for example. The substrate temperature is preferably selected to be no higher than 450° C. in order to avoid possible damage on the source and drain regions 27. The source and drain regions 27 is then exposed to laser rays from the upper side as illustrated in FIG. 2(D). The laser rays are preferably generated by a KrF excimer laser. The conditions of this laser annealing are as follows.

| | |
|---|---|
| Laser Energy Density: | 200 to 400 mJ/cm$^2$, e.g. 250 mJ/cm$^2$ |
| Sweeping repetition: | 5 times |
| Substrate temperature: | 300° C. |
| Atmosphere: | Vacuum (degree of vacuum is $10^{-2}$ torr or lower) |

As a result, relatively high sheet resistances of the source and drain regions 17 can be realized typically as high as 300 to 500 ohms per square even though the dose density is only a half of a conventionally employed density.

Figure 2E:
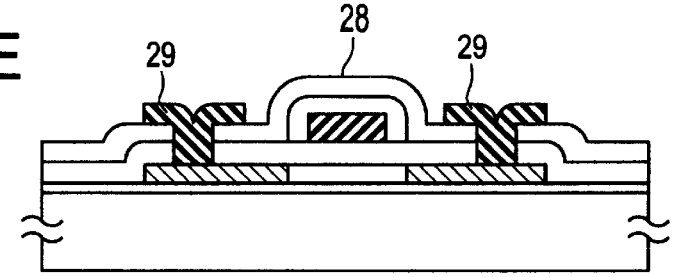

Next, A silicon oxide film 29 is deposited over the gate electrode 25 by a plasma CVD technique to a thickness of 2000 to 30000 angstroms, e.g. 6000 angstroms. After opening contact holes, an aluminum film is deposited to contact with the source and drain regions 27 respectively through the contact holes and patterned to provide source and drain electrodes 29 as illustrated in FIG. 2(E).

In accordance with experiments conducted by the inventors, the thin film transistors formed typically had carrier mobilities as high as 70 to 140 cm$^2$/Vs. Similar thin film transistors were formed in accordance with a conventional method and compared to the thin film transistor according to this embodiment of the present invention for the purpose of estimating the improvement of reliability in the same manner as in the case of the first embodiment explained above. As a result, the improvement of reliability was confirmed by the experiments in the same manner.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method of manufacturing a semiconductor device comprising:

forming a semiconductor layer over a substrate;
crystallizing said semiconductor layer;
patterning the crystallized semiconductor layer to form a semiconductor island; and
introducing an impurity into at least a portion of said semiconductor island to form source and drain regions,
wherein the crystallization is performed by a method comprising the steps of:
emitting a laser beam having a cross section from a laser device, said laser beam having a length and a width;
modifying an energy distribution of said laser beam in a widthwise direction of a cross section by using a lateral flyeye lens;
modifying an energy distribution of said laser beam in a lengthwise direction of a cross section by using a vertical flyeye lens;

condensing the laser beam after passing through said lateral flyeye lens in only the widthwise direction by using a first cylindrical convex lens;

condensing the laser beam after passing through said vertical flyeye lens in only the lengthwise direction by using a second cylindrical convex lens;

condensing the laser beam after passing through said first and second cylindrical convex lenses only in the widthwise direction by using a third cylindrical convex lens;

irradiating the laser beam after passing through first, second and third cylindrical convex lenses on said semiconductor layer; and moving said substrate along said widthwise direction so that said semiconductor layer is irradiated with the laser beam, wherein said third cylindrical convex lens is located distant from said first cylindrical convex lens by a distance larger than focal length of said first cylindrical convex lens.

2. A method according to claim 1 wherein said laser device is an excimer laser.

3. A method according to claim 1 wherein the length of the cross section of said laser beam after passing through first, second and third cylindrical convex lenses is 10 cm or greater.

4. A method according to claim 1 further comprising a step of heating said semiconductor film to crystallize said semiconductor film prior to the irradiation of the laser beam.

5. A method of manufacturing a semiconductor device comprising:

forming a semiconductor layer over a substrate;

crystallizing said semiconductor layer; and introducing an impurity into at least a portion of the crystallized semiconductor layer to form source and drain regions, wherein the crystallization is performed by a method comprising the steps of:

emitting a laser beam having a cross section from a laser device, said first laser beam having a length and a width;

modifying an energy distribution of said first laser beam in a widthwise direction of a cross section by using a lateral flyeye lens;

condensing the laser beam after passing through said lateral flyeye lens in only the widthwise direction by using a first cylindrical convex lens;

condensing the laser beam to after passing through said first cylindrical convex lens in only the widthwise direction by using a second cylindrical convex lens;

irradiating said semiconductor layer with the laser beam having passed through said second cylindrical convex lens; and moving said substrate along said widthwise direction so that said semiconductor layer is irradiated with the laser beam, wherein a magnification M satisfies the following relation:

M=(a distance between the first cylindrical convex lens and the second cylindrical convex lens)/(a distance between the second cylindrical convex lens and the semiconductor layer).

6. A method according to claim 5 wherein said laser beam is a pulsed laser beam and one site of said semiconductor layer is irradiated with plural number of pulses of said laser beam.

7. A method according to claim 5 wherein the distance between the first cylindrical convex lens and the second cylindrical convex lens and the distance between the second cylindrical convex lens and the semiconductor layer are variable to adjust said magnification.

8. A method according to claim 5 wherein the length of the laser beam after passing through said second cylindrical convex lens is 10 cm or greater.

9. A method of manufacturing a semiconductor device comprising:

forming a semiconductor layer over a substrate;

crystallizing said semiconductor layer; and introducing an impurity into at least a portion of said semiconductor layer to form source and drain regions, wherein the crystallization is performed by a method comprising the steps of:

emitting a laser beam having a cross section from a laser device, said laser beam having a length and a width;

modifying an energy distribution of said first laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said semiconductor layer with the laser beam having passed through said second cylindrical convex lens; and moving said substrate along said widthwise direction so that said semiconductor layer is irradiated with the laser beam, wherein a focal length F satisfies the following relation:

1/F=1/(a distance between the first cylindrical convex lens and the second cylindrical convex lens)+1/(a distance between the second cylindrical convex lens and the semiconductor layer).

10. A method according to claim 9 wherein said laser beam is a pulsed laser beam and one site of said semiconductor layer is irradiated with plural number of pulses of said laser beam.

11. A method according to claim 9 wherein the distance between the first cylindrical convex lens and the second cylindrical convex lens and the distance between the second cylindrical convex lens and the semiconductor layer are variable to adjust said focal length.

12. A method according to claim 9 wherein the length of the laser beam after passing through said second cylindrical convex lens is 10 cm or greater.

13. A method of manufacturing a semiconductor device comprising:

forming a semiconductor layer over a substrate;

crystallizing said semiconductor layer; and introducing an impurity into at least a portion of the crystallized semiconductor layer to form source and drain regions, wherein the crystallization is performed by a method comprising the steps of:

emitting a laser beam having a cross section from a laser device, said laser beam having a length and a width;

modifying an energy distribution of said first laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said semiconductor layer with the laser beam having passed through said second cylindrical convex lens; and moving said substrate along said widthwise direction so that said semiconductor layer is irradiated with the laser beam, wherein a magnification M and a focal length F satisfy the following relation:

M=(a distance between the first cylindrical convex lens and the second cylindrical convex lens)/(a distance between the second cylindrical convex lens and the semiconductor layer);

and

1/F=1/(a distance between the first cylindrical convex lens and the second cylindrical convex lens)+1/(a distance between the second cylindrical convex lens and the semiconductor layer).

14. A method according to claim 13 wherein said substrate is heated to a temperature from 100° C. to 500° C. during the irradiation.

15. A method of manufacturing a semiconductor device comprising:

forming a semiconductor layer over a substrate;

disposing a metal containing material in contact with said semiconductor layer, wherein said metal containing material is capable of promoting crystallization of the semiconductor layer;

crystallizing said semiconductor layer provided with said metal containing material; and introducing an impurity into at least a portion of the crystallized semiconductor layer to form source and drain regions, wherein the crystallization is performed by a method comprising the steps of:

emitting a laser beam having a cross section from a laser device, said laser beam having a length and a width;

modifying an energy distribution of said laser beam in a widthwise direction of a cross section by using a lateral flyeye lens;

modifying an energy distribution of said laser beam in a lengthwise direction of a cross section by using a vertical flyeye lens;

condensing the laser beam after passing through said lateral flyeye lens in only the widthwise direction by using a first cylindrical convex lens;

condensing the laser beam after passing through said vertical flyeye lens in only the lengthwise direction by using a second cylindrical convex lens;

condensing the laser beam after passing through said first and second cylindrical convex lenses only in the widthwise direction by using a third cylindrical convex lens;

irradiating the laser beam after passing through first, second and third cylindrical convex lenses on said semiconductor layer; and moving said substrate along said widthwise direction so that said semiconductor layer is irradiated with the laser beam, wherein said third cylindrical convex lens is located distant from said first cylindrical convex lens by a distance larger than focal length of said first cylindrical convex lens.

16. A method according to claim 15 wherein said laser device is an excimer laser.

17. A method according to claim 15 wherein the length of the laser beam after passing through said first, second and third cylindrical convex lens is 10 cm or greater.

18. A method according to claim 15 further comprising a step of heating said semiconductor film to crystallize said semiconductor film prior to the irradiation of the laser beam.

19. A method of manufacturing a semiconductor device comprising:

forming a semiconductor layer over a substrate;

crystallizing said semiconductor layer;

patterning the crystallized semiconductor layer to form a semiconductor island; and introducing an impurity into at least a portion of said semiconductor island to form source and drain regions, wherein the crystallization is performed by a method comprising the steps of:

emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said semiconductor layer with the laser beam having passed through said second cylindrical convex lens, and moving said substrate along said widthwise direction so that said semiconductor layer is irradiated with the laser beam, wherein a magnification M satisfies the following relation:

M=(a distance between the first cylindrical convex lens and the second cylindrical convex lens)/(a distance between the second cylindrical convex lens and the semiconductor layer).

20. The method according to claim 19 further comprising a step of heating said semiconductor layer to crystallize said semiconductor layer prior to the irradiation of the laser beam.

21. A method of manufacturing a semiconductor device comprising:

forming a semiconductor layer over a substrate;

crystallizing said semiconductor layer;

patterning the crystallized semiconductor layer to form a semiconductor island; and introducing an impurity into at least a portion of said semiconductor island to form source and drain regions, wherein the crystallization is performed by a method comprising the steps of:

emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said semiconductor layer with the laser beam having passed through said second cylindrical convex lens; and moving said substrate along said widthwise direction so that said semiconductor layer is irradiated with the laser beam, wherein a focal length F satisfies the following relation:

1/F=1/(a distance between the first cylindrical convex lens and the second cylindrical convex lens)+1/(a distance between the second cylindrical convex lens and the semiconductor layer).

22. The method according to claim 21 further comprising a step of heating said semiconductor layer to crystallize said semiconductor layer prior to the irradiation of the laser beam.

23. A method of manufacturing a semiconductor device comprising:

forming a semiconductor layer over a substrate;

crystallizing said semiconductor layer;

patterning the crystallized semiconductor layer to form a semiconductor island; and introducing an impurity into at least a portion of said semiconductor island to form source and drain regions, wherein the crystallization is performed by a method comprising the steps of:

emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said semiconductor layer with the laser beam having passed through said second cylindrical convex lens; and moving said substrate along said widthwise direction so that said semiconductor layer is irradiated with the laser beam, wherein said second cylindrical convex lens is located distant from said first cylindrical convex lens by a distance larger than focal length of said first cylindrical convex lens.

24. The method according to claim 23 further comprising a step of heating said semiconductor layer to crystallize said semiconductor layer prior to the irradiation of the laser beam.

25. A method of manufacturing a semiconductor device comprising:

forming a semiconductor layer over a substrate;

disposing a metal containing material in contact with said semiconductor layer, wherein said metal containing material is capable of promoting crystallization of the semiconductor layer;

crystallizing said semiconductor layer provided with said metal containing material; and introducing an impurity into at least a portion of the crystallized semiconductor layer to form source and drain regions, wherein the crystallization is performed by a method comprising the steps of:

emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said semiconductor layer with the laser beam having passed through said second cylindrical convex lens; and moving said substrate along said widthwise direction so that said semiconductor layer is irradiated with the laser beam, wherein said second cylindrical convex lens is located distant from said first cylindrical convex lens by a distance larger than focal length of said first cylindrical convex lens.

26. The method according to claim 25 further comprising a step of heating said semiconductor layer to crystallize said semiconductor layer prior to the irradiation of the laser beam.

27. A method of manufacturing a semiconductor device comprising:

forming an amorphous semiconductor layer on an insulating surface over a substrate;

crystallizing said amorphous semiconductor layer;

patterning the crystallized amorphous semiconductor layer to form a semiconductor island; and introducing an impurity into at least a portion of said semiconductor island to form source and drain regions, wherein the crystallization is performed by a method comprising the steps of:

emitting a laser beam having a cross section with a length and a width;

modifying an energy distribution of said laser beam in a widthwise direction of a cross section by using a lateral flyeye lens;

modifying an energy distribution of said laser beam in a lengthwise direction of a cross section by using a vertical flyeye lens;

condensing the laser beam after passing through said lateral flyeye lens in only the widthwise direction by using a first cylindrical convex lens;

condensing the laser beam after passing through said vertical flyeye lens in only the lengthwise direction by using a second cylindrical convex lens;

condensing the laser beam after passing through said first and second cylindrical convex lenses only in the widthwise direction by using a third cylindrical convex lens;

irradiating the laser beam after passing through first, second and third cylindrical convex lenses on said amorphous semiconductor layer; and moving said substrate along said widthwise direction so that said amorphous semiconductor layer is irradiated with the laser beam, wherein said third cylindrical convex lens is located distant from said first cylindrical convex lens by a distance larger than focal length of said first cylindrical convex lens.

28. The method according to claim 27 further comprising a step of heating said amorphous semiconductor layer to crystallize said amorphous semiconductor layer prior to the irradiation of the laser beam.

29. A method of manufacturing a semiconductor device comprising:

forming an amorphous semiconductor layer on an insulating surface over a substrate;

crystallizing said amorphous semiconductor layer;

patterning the crystallized amorphous semiconductor layer to form a semiconductor island; and introducing an impurity into at least a portion of said semiconductor island to form source and drain regions, wherein the crystallization is performed by a method comprising the steps of:

emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam to after passing through said first cylindrical convex lens in only the widthwise direction by using a second cylindrical convex lens;

irradiating said amorphous semiconductor layer with the laser beam having passed through said second cylindrical convex lens; and moving said substrate along said widthwise direction so that said amorphous semiconductor layer is irradiated with the laser beam, wherein said second cylindrical convex lens is located distant from said first cylindrical convex lens by a distance larger than focal length of said first cylindrical convex lens.

30. The method according to claim 29 further comprising a step of heating said amorphous semiconductor layer to crystallize said amorphous semiconductor layer prior to the irradiation of the laser beam.

31. A method of manufacturing a semiconductor device comprising:

forming an amorphous semiconductor layer on an insulating surface over a substrate;

crystallizing said amorphous semiconductor layer;

patterning the crystallized amorphous semiconductor layer to form a semiconductor island; and introducing an impurity into at least a portion of said semiconductor island to form source and drain regions, wherein the crystallization is performed by a method comprising the steps of:

emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said amorphous semiconductor layer with the laser beam having passed through said second cylindrical convex lens; and moving said substrate along said widthwise direction so that said amorphous semiconductor layer is irradiated with the laser beam, wherein a magnification M satisfies the following relation:

M=(a distance between the first cylindrical convex lens and the second cylindrical convex lens)/(a distance between the second cylindrical convex lens and the amorphous semiconductor layer).

32. The method according to claim 31 further comprising a step of heating said amorphous semiconductor layer to crystallize said amorphous semiconductor layer prior to the irradiation of the laser beam.

33. A method of manufacturing a semiconductor device comprising:

forming an amorphous semiconductor layer on an insulating surface over a substrate;

crystallizing said amorphous semiconductor layer;

patterning the crystallized amorphous semiconductor layer to form a semiconductor island; and introducing an impurity into at least a portion of said semiconductor island to form source and drain regions, wherein the crystallization is performed by a method comprising the steps of:

emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam after passing through said first cylindrical convex lens in only the widthwise direction by using a second cylindrical convex lens;

irradiating said amorphous semiconductor layer with the laser beam having passed through said second cylindrical convex lens; and moving said substrate along said widthwise direction so that said amorphous semiconductor layer is irradiated with the laser beam, wherein a focal length F satisfies the following relation:

1/F=1/(a distance between the first cylindrical convex lens and the second cylindrical convex lens)+1/(a distance between the second cylindrical convex lens and the amorphous semiconductor layer).

34. The method according to claim 33 further comprising a step of heating said amorphous semiconductor layer to crystallize said amorphous semiconductor layer prior to the irradiation of the laser beam.

35. A method of manufacturing a semiconductor device comprising:

forming a non-single crystalline semiconductor layer on an insulating surface over a substrate;

irradiating a laser beam to said non-single crystalline semiconductor layer in order to further promote crystallization thereof;

forming a gate electrode over the further crystallized semiconductor layer with a gate insulating layer therebetween; and introducing an impurity into at least a portion of said further crystallized semiconductor layer to form source and drain regions, wherein the irradiation is performed by a method comprising the steps of:

emitting a laser beam having a cross section with a length and a width;
modifying an energy distribution of said laser beam in a widthwise direction of a cross section by using a lateral flyeye lens;
modifying an energy distribution of said laser beam in a lengthwise direction of a cross section by using a vertical flyeye lens;
condensing the laser beam after passing through said lateral flyeye lens in only the widthwise direction by using a first cylindrical convex lens;
condensing the laser beam after passing through said vertical flyeye lens in only the lengthwise direction by using a second cylindrical convex lens;
condensing the laser beam after passing through said first and second cylindrical convex lenses only in the widthwise direction by using a third cylindrical convex lens;
irradiating the laser beam after passing through first, second and third cylindrical convex lenses on said non-single crystalline semiconductor layer; and
moving said substrate along said widthwise direction so that said non-single crystalline semiconductor layer is irradiated with the laser beam,
wherein said third cylindrical convex lens is located distant from said first cylindrical convex lens by a distance larger than the focal length of said first cylindrical convex lens.

36. The method according to claim 35 further comprising a step of heating said non-single crystalline semiconductor layer to crystallize said non-single crystalline semiconductor layer prior to the irradiation of the laser beam.

37. A method of manufacturing a semiconductor device comprising:
forming a non-single crystalline semiconductor layer on an insulating surface over a substrate;
irradiating a laser beam to said non-single crystalline semiconductor layer in order to further promote crystallization thereof;
forming a gate electrode over the further crystallized semiconductor layer with a gate insulating layer therebetween; and
introducing an impurity into at least a portion of said further crystallized semiconductor layer to form source and drain regions,
wherein the irradiation is performed by a method comprising the steps of:
emitting a laser beam having a cross section with a length and a width;
modifying an energy distribution of the laser beam in a widthwise direction of a cross section by using a lateral flyeye lens;
condensing the laser beam after passing through said lateral flyeye lens in only the widthwise direction by using a first cylindrical convex lens;
condensing the laser beam to after passing through said first cylindrical convex lens in only the widthwise direction by using a second cylindrical convex lens;
irradiating said non-single crystalline semiconductor layer with the laser beam having passed through said second cylindrical convex lens; and
moving said substrate along said widthwise direction so that said non-single crystalline semiconductor layer is irradiated with the laser beam,
wherein said second cylindrical convex lens is located distant from said first cylindrical convex lens by a distance larger than focal length of said first cylindrical convex lens.

38. The method according to claim 37 further comprising a step of heating said non-single crystalline semiconductor layer to crystallize said non-single crystalline semiconductor layer prior to the irradiation of the laser beam.

39. A method of manufacturing a semiconductor device comprising:
forming a non-single crystalline semiconductor layer on an insulating surface over a substrate;
irradiating a laser beam to said non-single crystalline semiconductor layer in order to further promote crystallization thereof;
forming a gate electrode over the further crystallized semiconductor layer with a gate insulating layer therebetween; and
introducing an impurity into at least a portion of said further crystallized semiconductor layer to form source and drain regions,
wherein the irradiation is performed by a method comprising the steps of:
emitting a laser beam having a cross section with a length and a width;
modifying an energy distribution of the laser beam in a widthwise direction of a cross section by using a lateral flyeye lens;
condensing the laser beam after passing through said lateral flyeye lens in only the widthwise direction by using a first cylindrical convex lens;
condensing the laser beam after passing through said first cylindrical convex lens in only the widthwise direction by using a second cylindrical convex lens;
irradiating said non-single crystalline semiconductor layer with the laser beam having passed through said second cylindrical convex lens; and
moving said substrate along said widthwise direction so that said non-single crystalline semiconductor layer is irradiated with the laser beam,
wherein a magnification M satisfies the following relation:

M=(a distance between the first cylindrical convex lens and the second cylindrical convex lens)/(a distance between the second cylindrical convex lens and the non-single crystalline semiconductor layer).

40. The method according to claim 39 further comprising a step of heating said non-single crystalline semiconductor layer to crystallize said non-single crystalline semiconductor layer prior to the irradiation of the laser beam.

41. A method of manufacturing a semiconductor device comprising:
forming a non-single crystalline semiconductor layer on an insulating surface over a substrate;
irradiating a laser beam to said non-single crystalline semiconductor layer in order to further promote crystallization thereof;
forming a gate electrode over the further crystallized semiconductor layer with a gate insulating layer therebetween; and
introducing an impurity into at least a portion of said further crystallized semiconductor layer to form source and drain regions,
wherein the irradiation is performed by a method comprising the steps of:
emitting a laser beam having a cross section with a length and a width;

modifying an energy distribution of the laser beam in a widthwise direction of a cross section by using a lateral flyeye lens;

condensing the laser beam after passing through said lateral flyeye lens in only the widthwise direction by using a first cylindrical convex lens;

condensing the laser beam to after passing through said first cylindrical convex lens in only the widthwise direction by using a second cylindrical convex lens;

irradiating said non-single crystalline semiconductor layer with the laser beam having passed through said second cylindrical convex lens; and moving said substrate along said widthwise direction so that said semiconductor layer is irradiated with the laser beam, wherein a focal length F satisfies the following relation:

1/F=1/(a distance between the first cylindrical convex lens and the second cylindrical convex lens)+1/(a distance between the second cylindrical convex lens and the non-single crystalline semiconductor layer).

42. The method according to claim 41 further comprising a step of heating said non-single crystalline semiconductor layer to crystallize said non-single crystalline semiconductor layer prior to the irradiation of the laser beam.

43. The method according to claim 1 wherein said semiconductor layer is a substantially intrinsic semiconductor layer.

44. The method according to claim 19 wherein said semiconductor layer is a substantially intrinsic semiconductor layer.

45. The method according to claim 21 wherein said semiconductor layer is a substantially intrinsic semiconductor layer.

46. The method according to claim 23 wherein said semiconductor layer is a substantially intrinsic semiconductor layer.

* * * * *